United States Patent
Kuwajima et al.

(10) Patent No.: US 10,426,032 B1
(45) Date of Patent: Sep. 24, 2019

(54) MULTILAYER WIRING STRUCTURE AND ITS MANUFACTURING METHOD

(71) Applicant: TDK Corporation, Tokyo (JP)

(72) Inventors: Hajime Kuwajima, Tokyo (JP); Tomonaga Nishikawa, Tokyo (JP); Takashi Ohtsuka, Tokyo (JP); Takeshi Oohashi, Tokyo (JP); Yuichiro Okuyama, Tokyo (JP); Manabu Yamatani, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/374,556

(22) Filed: Apr. 3, 2019

(30) Foreign Application Priority Data

Apr. 6, 2018 (JP) ................. 2018-073953

(51) Int. Cl.
*H05K 1/09* (2006.01)
*H05K 1/02* (2006.01)
*H05K 3/02* (2006.01)
*H05K 1/11* (2006.01)
*H05K 3/06* (2006.01)
*H05K 3/46* (2006.01)

(52) U.S. Cl.
CPC ............... *H05K 1/115* (2013.01); *H05K 1/09* (2013.01); *H05K 1/111* (2013.01); *H05K 3/06* (2013.01); *H05K 3/4644* (2013.01)

(58) Field of Classification Search
CPC .......... H05K 1/09; H05K 1/092; H05K 1/095; H05K 1/097; H05K 3/02; H05K 3/04; H05K 3/06
See application file for complete search history.

(56) References Cited

FOREIGN PATENT DOCUMENTS

JP            2001127155 A       5/2001

*Primary Examiner* — Jeremy C Norris
(74) *Attorney, Agent, or Firm* — Young Law Firm, P.C.

(57) ABSTRACT

Disclosed herein is a multilayer wiring structure that includes a first metal layer; an interlayer insulating film formed on the first metal layer, the interlayer insulating film having an opening that exposes a first area of the first metal layer; a second metal layer formed on an inner wall of the opening; and a third metal layer filling the opening via the second metal layer. The first and third metal layers are direct contact with each other at a bottom of the opening.

15 Claims, 10 Drawing Sheets

MULTILAYER WIRING STRUCTURE AND ITS MANUFACTURING METHOD

BACKGROUND OF THE INVENTION

Field of the Invention

The present invention relates to a multilayer wiring structure and its manufacturing method and, more particularly, to a multilayer wiring structure included in an electric component or a printed circuit board and its manufacturing method.

Description of Related Art

Electronic components or printed circuit boards may include a multilayer wiring structure obtained by laminating a plurality of wiring layers through interlayer insulating films. In the multilayer wiring structure, an adhesion layer formed of chromium (Cr) or the like is often used in order to enhance adhesion between a conductive pattern and the interlayer insulating film. For example, in a printed circuit board described in JP 2001-127155 A, an adhesion layer formed of chromium (Cr) is provided on the upper surface of copper wiring to thereby ensure adhesion between the copper wiring and the interlayer insulating film covering the copper wire.

Further, in JP 2001-127155 A, a via hole is formed in the interlayer insulating film to expose the copper wiring, followed by formation of a plating film by electroless plating. However, the electroless plating is not only lower in film formation rate than electrolytic plating, but also higher in process cost. Therefore, it is preferable to perform the electrolytic plating in place of the electroless plating; in this case, however, a thin seed layer for power feeding is required.

When the seed layer is formed in the via hole, it may remain between lower and upper wiring layers. The seed layer is formed of a metal material such as chromium (Cr) and having a thermal expansion coefficient different from that of copper (Cu) used as a material for a main conductive layer, so that when a severe test such as a thermal shock test, a moisture absorption reflow test, or a humidity resistance performance test is executed, the seed layer is destroyed due to stress generated at the boundary between the seed layer and the main conductive layer, which may result in a conduction failure of the via. Further, the conductive pattern and the interlayer insulating film differ from each other in thermal expansion coefficient or hygroscopicity; therefore, when the main conductive layer or interlayer insulating film is formed thick, execution of the severe test as mentioned above may destroy the seed layer due to stress generated at the boundary between the seed layer and the main conductive layer, which may result in a conduction failure of the via.

SUMMARY

It is therefore an object of the present invention to provide a multilayer wiring structure capable of preventing a conduction failure of the via caused due to destruction of the seed layer and its manufacturing method.

A multilayer wiring structure according to the present invention is a multilayer wiring structure obtained by laminating a plurality of wiring layers including first and second wiring layers. The multilayer wiring structure includes a first conductive pattern provided in the first wiring layer and including a first main conductive layer, an interlayer insulating film covering the first wiring layer and having an opening for exposing therethrough a part of the first conductive pattern, and a second conductive pattern provided in the second wiring layer and connected to the first conductive pattern through the opening. The second conductive pattern includes a seed layer contacting the interlayer insulating film and a second main conductive layer provided on the seed layer and formed of the same metal material as the first main conductive layer. The seed layer is removed at least at a part of the bottom portion of the opening, and thus the first and second main conductive layers are brought into contact with each other at least at that part of the bottom portion of the opening without the seed layer being interposed therebetween.

According to the present invention, the seed layer is removed at least at a part of the bottom portion of the opening, and thus the first and second main conductive layers are brought into direct contact with each other at least at that part of the bottom portion of the opening. Thus, even if the seed layer is destroyed, a conduction failure can be prevented since there exists a portion where the first and second main conductive layers directly contact each other.

In the present invention, the inner wall surface and bottom outer peripheral edge of the opening may be covered with the seed layer, and the first and second main conductive layers may be brought into contact with each other at the center portion surrounded by the outer peripheral edge without the seed layer being interposed therebetween. This allows power to be fed to the first main conductive layer through the seed layer, so that it is possible to form the second main conductive layer inside the opening by electrolytic plating without performing power feeding to the first main conductive layer separately. In addition, the outer peripheral edge of the opening is covered with the seed layer, thereby making it possible to prevent the interlayer insulating film constituting the outer peripheral edge of the opening from peeling off at its edge.

In the present invention, the first and second main conductive layers may be formed of copper (Cu). This can reduce the resistance value of each of the first and second wiring layers.

In the present invention, the seed layer may be formed of chromium (Cr), nickel (Ni), titanium (Ti), tungsten (W), tantalum (Ta), or an alloy or laminate including any of the elements. This allows the seed layer to function as an adhesion layer, thereby making it possible to enhance adhesion between the main conductive layer formed of copper (Cu) and the interlayer insulating film.

The crystal of copper (Cu) constituting the first and second main conductive layers may exist while crossing the boundary defining the bottom portion of the opening at a portion where the first and second main conductive layers are in contact with each other. This eliminates the boundary between the first and second main conductive layers, achieving higher adhesion therebetween.

A multilayer wiring structure manufacturing method according to the present invention is a manufacturing method for a multilayer wiring structure obtained by laminating a plurality of wiring layers including first and second wiring layers and includes: a first step of forming, in the first wiring layer, a first conductive pattern including a first main conductive layer; a second step of forming an interlayer insulating film covering the first wiring layer; a third step of forming, in the interlayer insulating film, an opening for exposing therethrough a part of the first main conductive layer; a fourth step of forming a seed layer on the interlayer insulating film and inside the opening; a fifth step of exposing the first main conductive layer by removing at least partially the seed layer formed on the bottom portion of the opening; and a sixth step of forming a second main conductive layer formed of the same metal material as the first main conductive layer on the seed layer and the first main conductive layer exposed from the opening.

According to the present invention, the seed layer formed at the bottom portion of the opening is removed at least partially, allowing the first and second main conductive layers to be brought into direct contact with each other at least at that part of the bottom portion of the opening. Thus, even if the seed layer is destroyed, a conduction failure can be prevented since there exists a portion where the first and second main conductive layers directly contact each other.

In the fifth step, the seed layer formed at the bottom portion of the opening may be partially removed so that a contact portion between the first main conductive layer and the seed layer remains there. Thus, when electrolytic plating is performed by power feeding through the seed layer in the sixth step, it is possible to form the second main conductive layer inside the opening by the electrolytic plating without separately feeding power to the first main conductive layer.

In the present invention, the seed layer may include a lower seed layer formed of chromium (Cr), nickel (Ni), titanium (Ti), tungsten (W), tantalum (Ta), or an alloy or laminate including any of the elements and an upper seed layer formed of copper (Cu). This can significantly reduce the resistance value of the seed layer.

As described above, according to the multilayer wiring structure and its manufacturing method of the present invention, it is possible to prevent a conduction failure of the via caused due to destruction of the seed layer.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

First Embodiment

Figure 1:
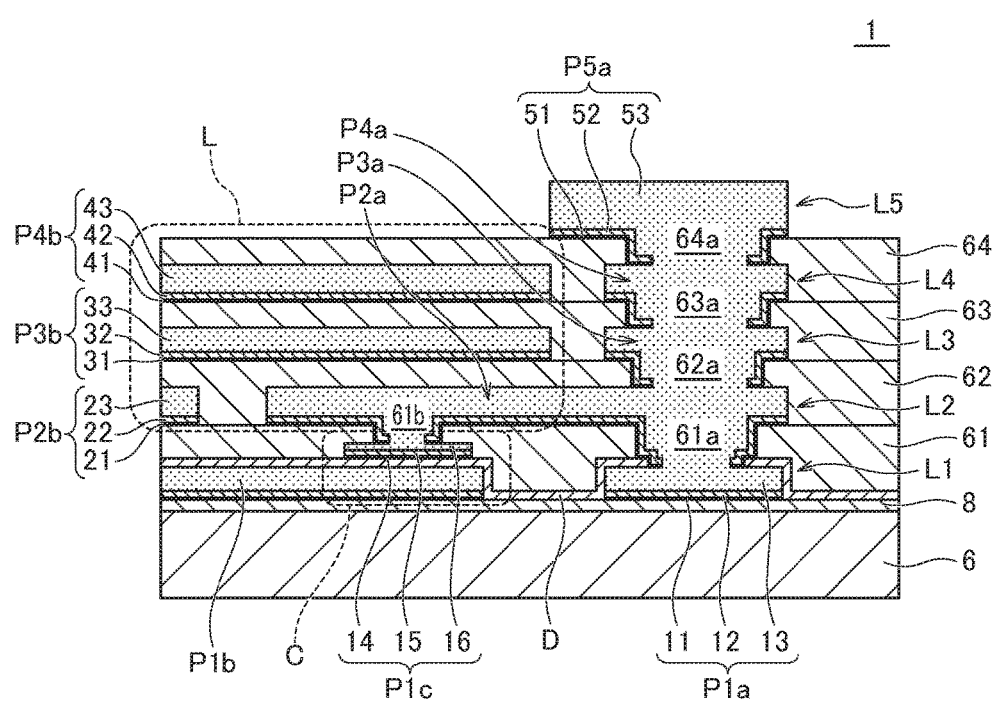
FIG. 1 is a schematic cross-sectional view for explaining the structure of a multilayer wiring structure according to a first embodiment of the present invention.

FIG. 1 is a schematic cross-sectional view for explaining the structure of a multilayer wiring structure 1 according to the first embodiment of the present invention.

The multilayer wiring structure 1 according to the present embodiment constitutes a part of a chip-type electronic component (e.g., a filter, a balun, a diplexer, a resonator, a directional coupler, or the like) having integrated elements such as a capacitor C and an inductor L. However, the application target of the multilayer wiring structure according to the present invention is not limited to this, and is applicable to various electronic components, various module components, various circuit boards, and the like.

As illustrated in FIG. 1, the multilayer wiring structure 1 according to the present embodiment includes a substrate 6, an insulating film 8 formed on the substrate 6, and first to fifth wiring layers L1 to L5 laminated on the insulating film 8. There is no particular restriction on the material of the substrate 6, and inorganic materials such as ferrite, glass, and ceramics, and resin materials can be used. The insulating film 8 is a planarization film formed of an insulating material such as $SiO_2$ or $Al_2O_3$. For the insulating film 8, inorganic materials and resin materials can be used. The insulating film 8 may be omitted when insulation or sufficient surface flatness can be obtained by the material of the substrate 6.

The wiring layer L1 has conductive patterns P1a and P1b each composed of a lower seed layer 11, an upper seed layer 12, and a main conductive layer 13. The lower seed layer 11 is formed of chromium (Cr), nickel (Ni), titanium (Ti), tungsten (W), tantalum (Ta), or an alloy or laminate including any of the elements and functions as an adhesion layer. Although not particularly limited, the thickness of the lower seed layer 11 is about 0.01 μm. The upper seed layer 12 is formed of copper (Cu) and plays a role of reducing the resistance value of a power line in an electrolytic plating process to be described later. Although not particularly limited, the thickness of the upper seed layer 12 is about 0.2 μm to about 0.4 μm. The main conductive layer 13 is formed of copper (Cu). Although not particularly limited, the thickness of the main conductive layer 13 is about 5 μm to 70 μm.

As illustrated in FIG. 1, the conductive pattern P1b is completely covered with a capacitive insulating film D formed of an insulating material such as $Si_3N_4$, while the upper portion of the conductive pattern P1a is exposed through an opening formed in the capacitive insulating film D. The conductive pattern P1b functions as a lower capacitive electrode for the capacitor C, and a conductive pattern P1c functioning as an upper capacitive electrode is formed on the surface of the capacitive insulating film D covering the conductive pattern P1b. The conductive pattern P1c includes a lower seed layer 14, an upper seed layer 15, and a main conductive layer 16.

The wiring layer L1 is covered with an interlayer insulating film 61, and a wiring layer L2 is formed on the interlayer insulating film 61. There is no particular restriction on the material of the interlayer insulating film 61, and resin materials such as polyimide, benzocyclobutene, BT resin, epoxy, and acrylic, or inorganic materials such as $Al_2O_3$, $SiO_2$, and $Si_3N_4$ can be used. The same material as the interlayer insulating film 61 can be used for interlayer insulating films 62 to 64 positioned above the interlayer insulating film 61. The wiring layer L2 has conductive patterns P2a and P2b each composed of a lower seed layer 21, an upper seed layer 22, and a main conductive layer 23. The materials and thicknesses of the lower seed layer 21, upper seed layer 22, and main conductive layer 23 are the same as those of the lower seed layer 11, upper seed layer 12, and main conductive layer 13, respectively. The materials and thicknesses of lower seed layers 31, 41, and 51 included respectively in the wiring layers L3 to L5 can also be made the same as those of the lower seed layer 11, the materials and thicknesses of upper seed layers 32, 42, and 52 included respectively in the wiring layers L3 to L5 can also be made the same as those of the upper seed layer 12, and the materials and thicknesses of main conductive layers 33, 43, and 53 included respectively in the wiring layers L3 to L5 can also be made the same as those of the main conductive layer 13. However, the thicknesses of the above layers need not be the same and may differ as appropriate. Openings 61*a* and 61*b* for exposing therethrough the respective conductive patterns P1*a* and P1*b* are formed in the interlayer insulating film 61, and the conductive patterns P2*a* and P2*b* are connected respectively to the conductive patterns P1*a* and P1*c* through the openings 61*a* and 61*b*.

The lower seed layer 21 and upper seed layer 22 are removed at substantially the bottom center portions of the respective openings 61*a* and 61*b*. As a result, the main conductive layers 13, 16 and main conductive layer 23 are brought into contact with each other at substantially the bottom center portions of the respective openings 61*a* and 61*b* without the seed layer being interposed therebetween. The lower seed layer 21 and upper seed layer 22 remain in other portions. That is, the upper surface of the interlayer insulating film 61, the inner wall surfaces of the respective openings 61*a* and 61*b*, and the outer peripheral edges of the bottom portions of the respective openings 61*a* and 61*b* are covered with the lower seed layer 21 and the upper seed layer 22.

The wiring layer L2 is covered with the interlayer insulating film 62, and the wiring layer L3 is formed on the interlayer insulating film 62. The wiring layer L3 has conductive patterns P3*a* and P3*b* each composed of a lower seed layer 31, an upper seed layer 32, and a main conductive layer 33. An opening 62*a* for exposing therethrough the conductive pattern P2*a* is formed in the interlayer insulating film 62, and the conductive pattern P3*a* is connected to the conductive pattern P2*a* through the opening 62*a*.

The lower seed layer 31 and upper seed layer 32 are removed at substantially the bottom center portion of the opening 62*a*. As a result, the main conductive layer 23 and the main conductive layer 33 are brought into contact with each other at substantially the bottom center portion of the opening 62*a* without the seed layer being interposed therebetween. The lower seed layer 31 and upper seed layer 32 remain in other portions. That is, the upper surface of the interlayer insulating film 62, the inner wall surface of the opening 62*a*, and the outer peripheral edge of the bottom portion of the opening 62*a* are covered with the lower seed layer 31 and the upper seed layer 32.

The wiring layer L3 is covered with the interlayer insulating film 63, and the wiring layer L4 is formed on the interlayer insulating film 63. The wiring layer L4 has conductive patterns P4*a* and P4*b* each composed of a lower seed layer 41, an upper seed layer 42, and a main conductive layer 43. An opening 63*a* for exposing therethrough the conductive pattern P3*a* is formed in the interlayer insulating film 63, and the conductive pattern P4*a* is connected to the conductive pattern P3*a* through the opening 63*a*.

The lower seed layer 41 and upper seed layer 42 are removed at substantially the bottom center portion of the opening 63*a*. As a result, the main conductive layer 33 and the main conductive layer 43 are brought into contact with each other at substantially the bottom center portion of the opening 63*a* without the seed layer being interposed therebetween. The lower seed layer 41 and upper seed layer 42 remain in other portions. That is, the upper surface of the interlayer insulating film 63, the inner wall surface of the opening 63*a*, and the outer peripheral edge of the bottom portion of the opening 63*a* are covered with the lower seed layer 41 and the upper seed layer 42.

The conductive patterns P2*a*, P2*b*, P3*b*, and P4*b* are elements constituting a part of the inductor L or a transmission line.

The wiring layer L4 is covered with the interlayer insulating film 64, and the wiring layer L5 is formed on the interlayer insulating film 64. The wiring layer L5 has a conductive pattern P5*a* composed of a lower seed layer 51, an upper seed layer 52, and a main conductive layer 53. An opening 64*a* for exposing therethrough the conductive pattern P4*a* is formed in the interlayer insulating film 64, and the conductive pattern P5*a* is connected to the conductive pattern P4*a* through the opening 64*a*.

The lower seed layer 51 and upper seed layer 52 are removed at substantially the bottom center portion of the opening 64*a*. As a result, the main conductive layer 43 and the main conductive layer 53 are brought into contact with each other at substantially the bottom center portion of the opening 64*a* without the seed layer being interposed therebetween. The lower seed layer 51 and upper seed layer 52 remain in other portions. That is, the upper surface of the interlayer insulating film 64, the inner wall surface of the opening 64*a*, and the outer peripheral edge of the bottom portion of the opening 64*a* are covered with the lower seed layer 51 and the upper seed layer 52.

The conductive pattern P5*a* is used as an external terminal (e.g., a bonding pad). When the conductive pattern P5*a* is used as the external terminal, an Ni/Au electrode, an Ni/Sn electrode, or an Ni/Ag electrode can be formed on the surface of the conductive pattern P5*a* to form an LGA pad, or a soldering hole is formed to constitute a BGA pad so as to allow soldering to be carried out. Further, by forming an Ni/Au electrode or an Ni/Pd/Au electrode on the surface of the conductive pattern P5*a*, the conductive pattern P5*a* can be used as a wire bonding pad or a bump bonding pad.

As described above, in the multilayer wiring structure 1 according to the present embodiment, the seed layer is removed at substantially the bottom center portions of the respective openings 61*a* to 64*a* and 61*b*. Thus, at these portions, the main conductive layer (e.g., main conductive layer 13) in the lower layer and the main conductive layer (e.g., main conductive layer 23) in the upper layer are brought into direct contact with each other. That is, at these portions, the seed layer does not exist, so that even when a severe test such as a thermal shock test, a moisture absorption reflow test, or a humidity resistance performance test is executed, a conduction failure due to destruction of the seed layer is not generated.

In addition, the inner wall surfaces and outer peripheral edges of the bottom portions of the respective openings 61*a* to 64*a* and 61*b* are covered with the seed layer, and the seed layer is removed only at the center portion surrounded by the outer peripheral edge, so that the edges of the respective interlayer insulating films 61 to 64 constituting the outer peripheral edges of the openings 61*a* to 64*a* and 61*b* are covered with the lower seed layers 11, 21, 31, 41, and 51 having high adhesion. This prevents the interlayer insulating films 61 to 64 from peeling off at their edges.

The following describes a manufacturing method for the multilayer wiring structure 1 according to the present embodiment.

FIGS. 2 to 16 are process views for explaining the manufacturing method for the multilayer wiring structure 1 according to the present embodiment.

Figure 2:
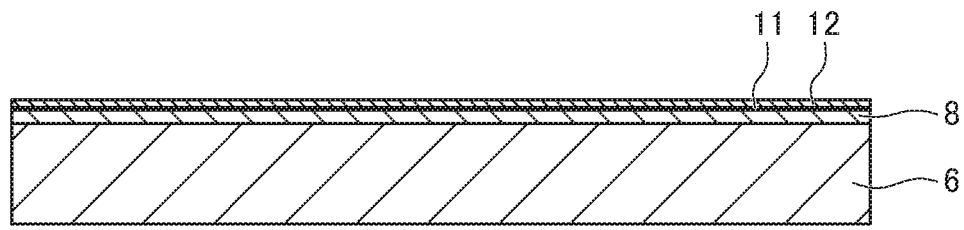
FIGS. 2 to 16 are process views for explaining the manufacturing method for the multilayer wiring structure according to the first embodiment of the present invention.

First, as illustrated in FIG. 2, the substrate 6 formed of ceramics or the like is prepared, and the insulating film 8 for planarization formed of an insulating material such as $Al_2O_3$ is formed on the surface of the substrate 6 by a sputtering method. Then, the lower seed layer 11 formed of chromium (Cr) and the upper seed layer 12 formed of copper (Cu) are formed on the surface of the insulating film 8 by a sputtering method.

Figure 3:
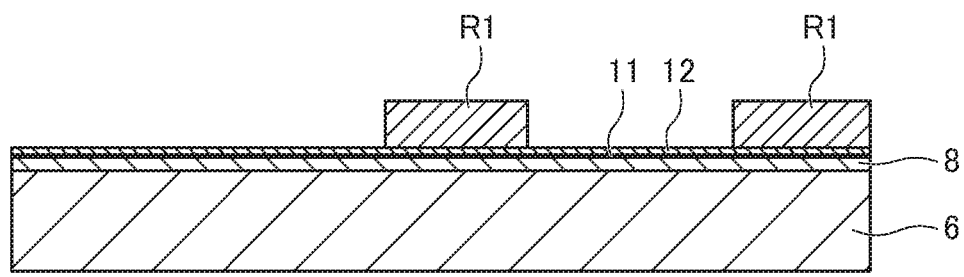
Figure 4:
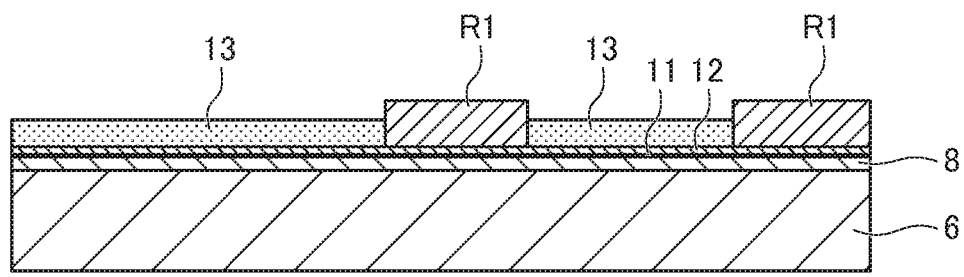

Subsequently, as illustrated in FIG. 3, a photoresist R1 is formed on the entire surface of the upper seed layer 12, followed by exposure and development using a photolithography method, whereby the photoresist R1 is patterned. Then, electrolytic plating is performed in this state to form the main conductive layer 13 at portions where the photoresist R1 does not exist, as illustrated in FIG. 4. When performing the electrolytic plating, power is fed through the lower seed layer 11 and upper seed layer 12. At this time, electric resistance during power feeding can be reduced since the upper seed layer 12 is formed of copper (Cu) which is low in resistance value and having a film thickness sufficiently larger than that of the lower seed layer 11, although the lower seed layer 11 is formed of a material having a comparatively high resistance value, such as chromium (Cr), and having a very small film thickness.

Figure 5:
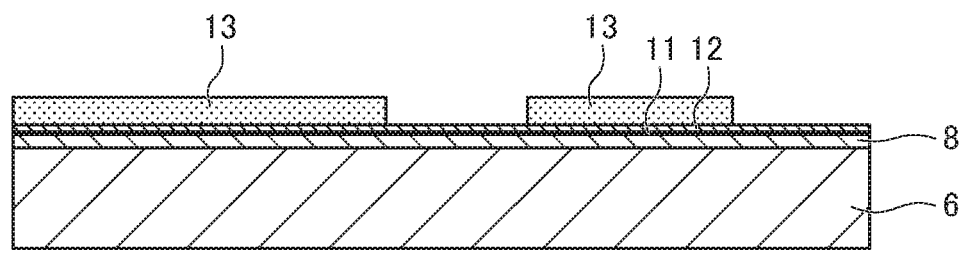
Figure 6:
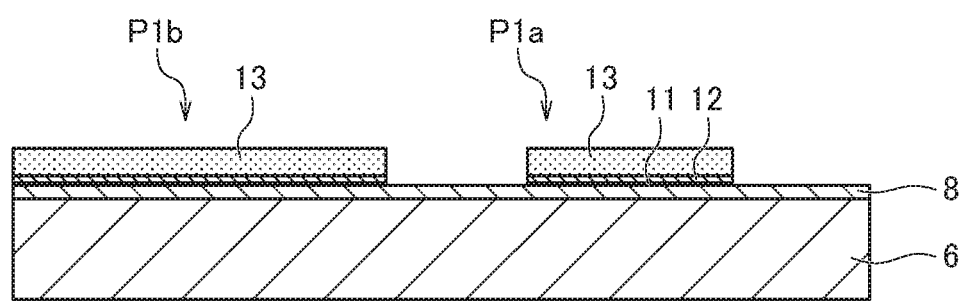

Subsequently, as illustrated in FIG. 5, the photoresist R1 is peeled off, and then, as illustrated in FIG. 6, the lower seed layer 11 and upper seed layer 12 at portions where they are not covered with the main conductive layer 13 are removed. As a result, the conductive patterns P1*a* and P1*b* are electrically isolated. The removal of the lower seed layer 11 and upper seed layer 12 can be carried out by wet-etching or dry-etching.

Figure 7:
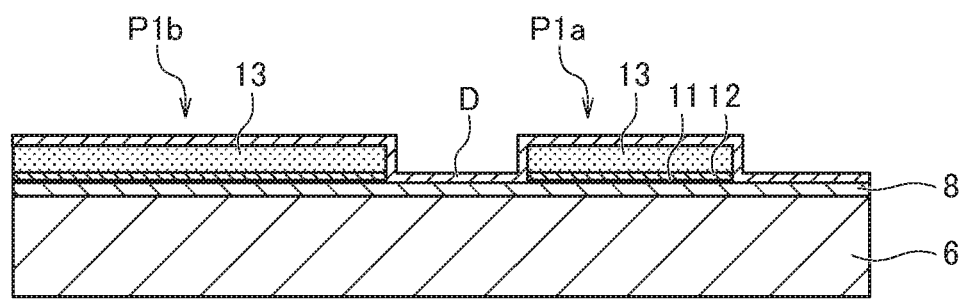
Figure 8:
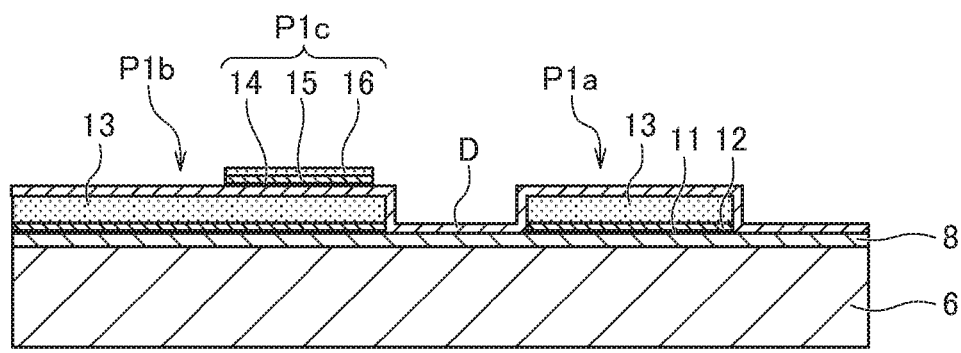
Figure 9:
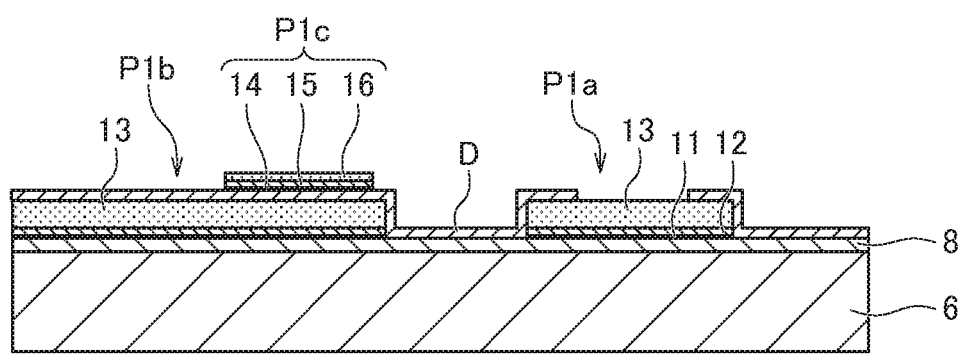
Figure 10:
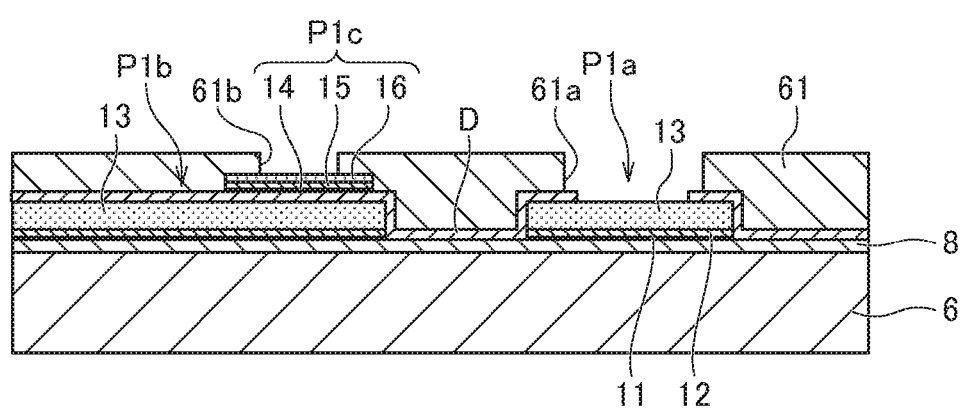

Subsequently, as illustrated in FIG. 7, the capacitive insulating film D formed of $Si_3N_4$ is formed on the entire exposed surface by a CVD method or a sputtering method. Further, as illustrated in FIG. 8, the lower seed layer 14, upper seed layer 15, and main conductive layer are laminated in this order on the surface of the capacitive insulating film D and then patterned to thereby form the conductive pattern P1*c* on the conductive pattern P1*b* through the capacitive insulating film D. Further, as illustrated in FIG. 9, the capacitive insulating film D is patterned to expose the upper surface of the conductive pattern P1*a*. Then, as illustrated in FIG. 10, the interlayer insulating film 61 is formed on the entire exposed surface and then patterned to thereby form the openings 61*a* and 61*b* for exposing therethrough the respective conductive patterns P1*a* and P1*c*. The formation of the interlayer insulating film 61 is achieved by application of ultraviolet curable resin onto the entire exposed surface, followed by exposure and development using a photolithography method and then by curing.

Figure 11:
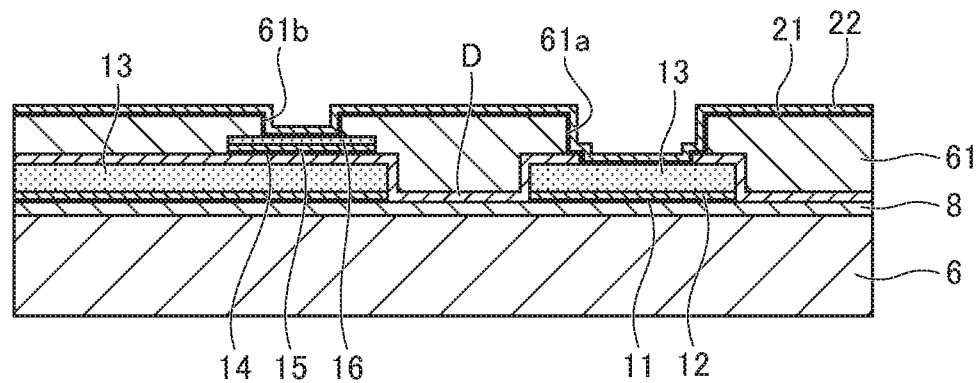

Subsequently, as illustrated in FIG. 11, the lower seed layer 21 formed of chromium (Cr) and the upper seed layer 22 formed of copper (Cu) are sequentially formed on the entire exposed surface including the inner portions of the respective openings 61*a* and 61*b* by a sputtering method. As a result, the inner wall surfaces and bottom surfaces (upper surface of the main conductive layer 13) of the respective openings 61*a* and 61*b* are brought into contact with the lower seed layer 21.

Figure 12:
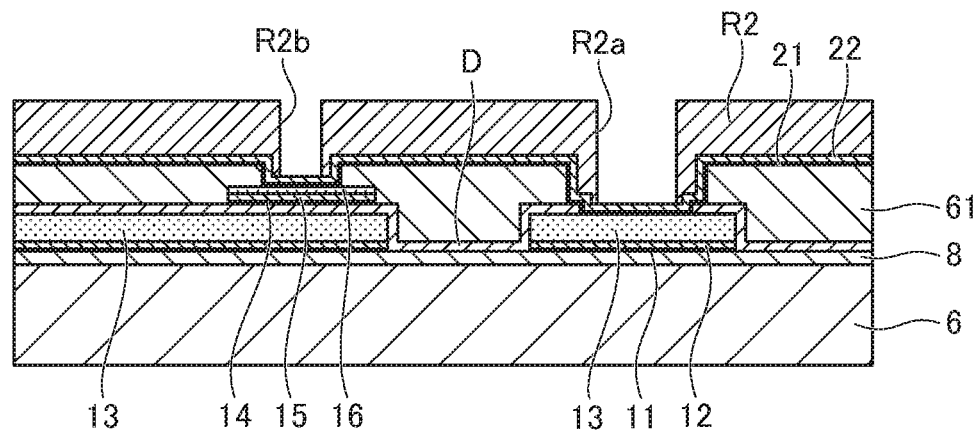
Figure 17:
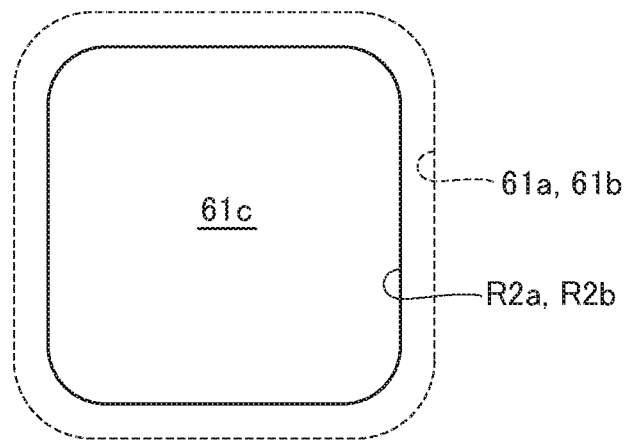
FIG. 17 is a schematic diagram indicating a planar pattern shape of a photoresist.

Subsequently, as illustrated in FIG. 12, a photoresist R2 is formed on the entire surface of the upper seed layer 22, followed by exposure and development using a photolithography method, whereby the photoresist R2 is patterned. The planar pattern shape of the photoresist R2 is as illustrated in FIG. 17. That is, the photoresist R2 covers the inner wall surfaces of the respective openings 61*a* and 61*b* and exposes the bottom center portions of the respective openings 61*a* and 61*b*. This indicates that the opening portions R2*a* and R2*b* of the photoresist R2 are slightly smaller in diameter than the respective openings 61*a* and 61*b* of the interlayer insulating film 61.

Figure 13:
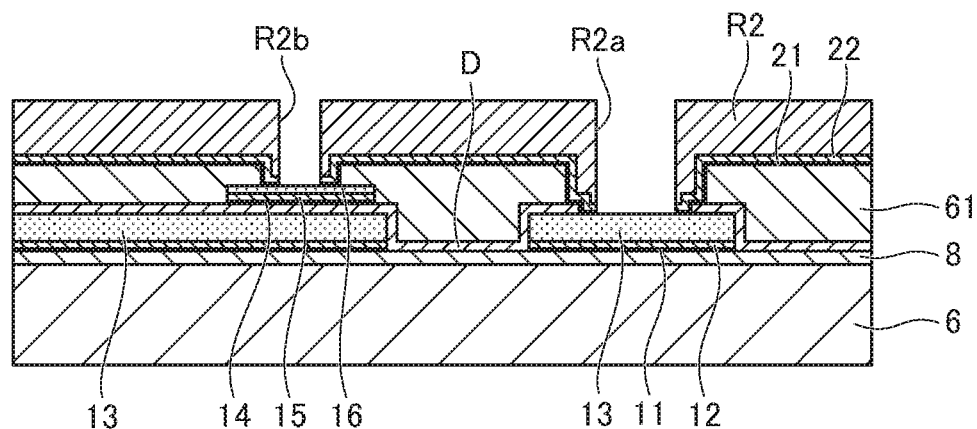

In this state, the upper seed layer 22 and lower seed layer 21 are sequentially etched with the photoresist R2 used as a mask. Thus, as illustrated in FIG. 13, the upper seed layer 22 and lower seed layer 21 at portions where they are not covered with the photoresist R2 are removed, with the result that the main conductive layer 13 of the wiring layer L1 is exposed. There is no particular restriction on the removal method for the upper seed layer 22 and lower seed layer 21, and dry-etching, wet-etching, or the like can be used. Alternatively, the following procedure may be taken, in which the upper seed layer 22 is patterned with the photoresist R2 used as a mask, followed by removal of the photoresist R2, and then the lower seed layer 21 is patterned with the patterned upper seed layer 22 used as a mask.

Figure 18:
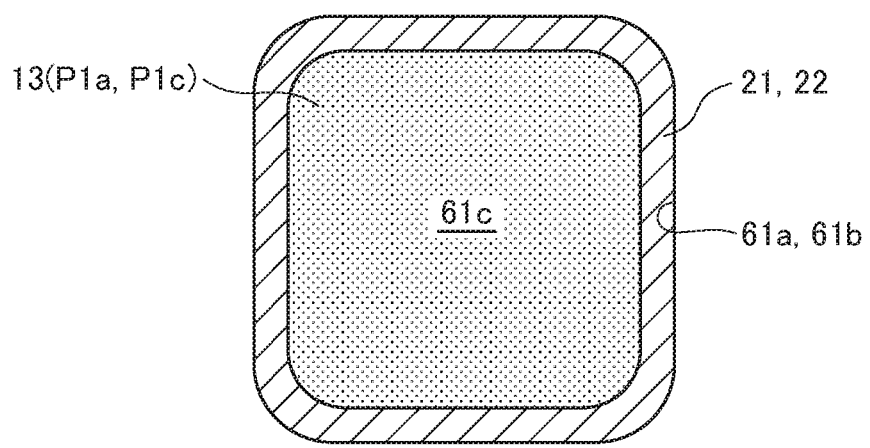
FIG. 18 is a schematic diagram indicating a planar pattern shape of a lower seed layer and an upper seed layer.

Thereafter, the photoresist R2 is removed. Thus, as illustrated in FIG. 18, which is a plan view, the inner wall surfaces and bottom outer peripheral edges of the respective openings 61*a* and 61*b* are covered with the lower seed layer 21 and upper seed layer 22. On the other hand, a center portion 61*c* surrounded by the outer peripheral edge is not covered with the lower seed layer 21 and upper seed layer 22, and the main conductive layer 13 is exposed.

Figure 14:
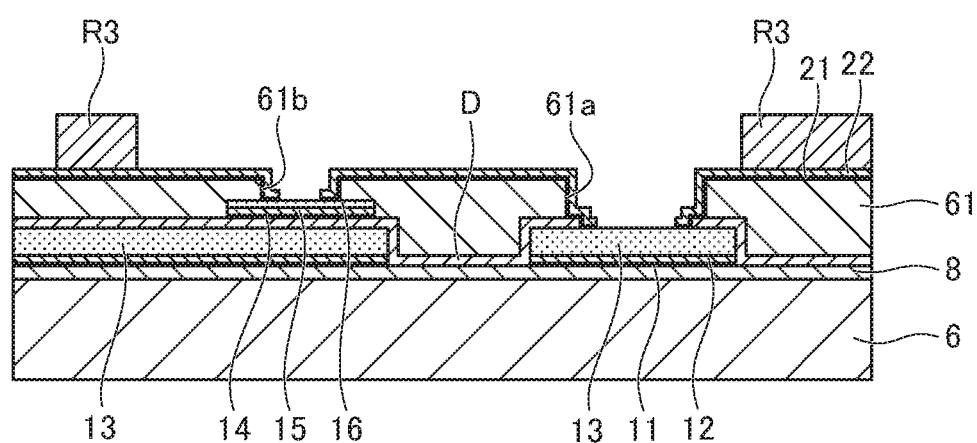
Figure 15:
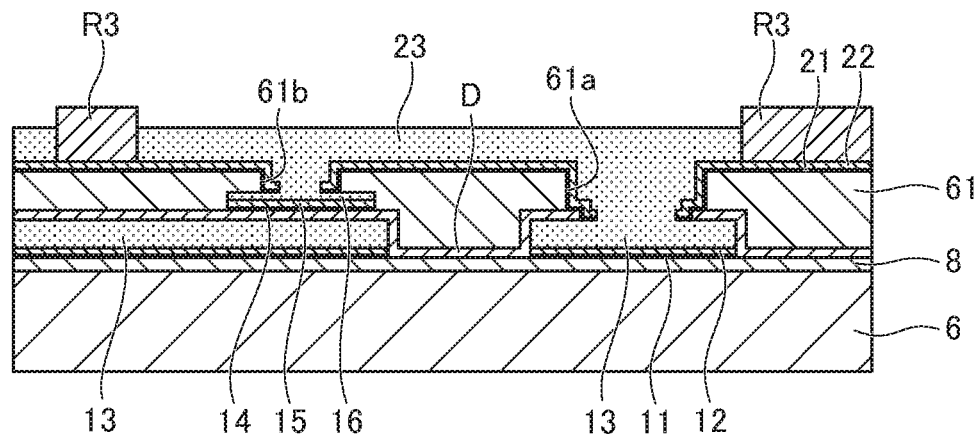

Subsequently, as illustrated in FIG. 14, a photoresist R3 is formed on the entire exposed surface, followed by exposure and development using a photolithography method, whereby the photoresist R3 is patterned. Then, electrolytic plating is performed in this state to form the main conductive layer 23 at portions where the photoresist R3 does not exist, as illustrated in FIG. 15. When performing the electrolytic plating, power is fed through the lower seed layer 21 and upper seed layer 22. As described above, the lower seed layer 21 and upper seed layer 22 remain in the bottom outer peripheral edges of the respective openings 61*a* and 61*b*, and thus the lower and upper seed layers 21 and 22 and the main conductive layer 13 are brought into contact with each other at these portions, so that when power is fed through the lower seed layer 21 and upper seed layer 22, power is also fed to the main conductive layer 13. This allows a plating film to be properly grown even at the bottom center portions of the respective openings 61*a* and 61*b*, which are not covered with the lower seed layer 21 and upper seed layer 22.

Figure 19:
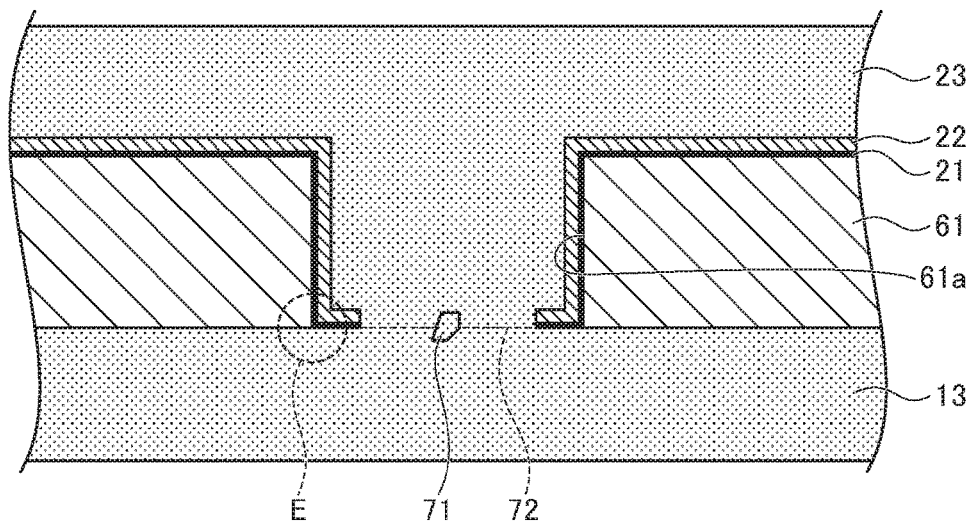
FIG. 19 is an enlarged sectional view of an opening.

The main conductive layer 23 formed directly on the surface of the main conductive layer 13 by plating is integrated with the main conductive layer 13 as the plating is grown, with the result that the boundary between the main conductive layers 13 and 23 is eliminated. More specifically, the crystal of copper (Cu) constituting the main conductive layer 13 is continuously grown and, as illustrated in FIG. 19, crystal 71 of copper (Cu) constituting the main conductive layers 13 and 23 exists while crossing a boundary 72 defining the bottom portion of the opening 61*a* at a portion where the main conductive layers 13 and 23 are in contact with each other.

Figure 16:
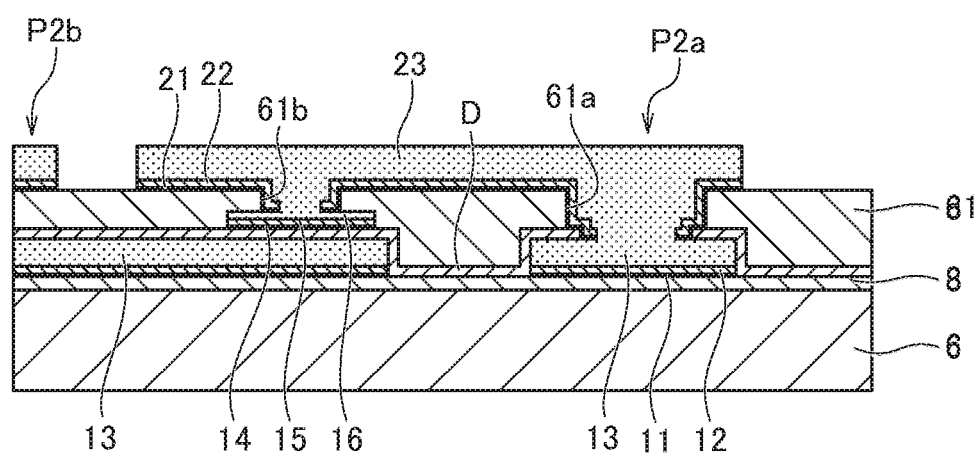

Subsequently, as illustrated in FIG. 16, the photoresist R3 is removed, and the lower seed layer 21 and upper seed layer 22 at portions where they are not covered with the main conductive layer 23 are removed by wet-etching or dry-etching. As a result, the conductive patterns P2*a* and P2*b* are electrically isolated.

Thereafter, the process illustrated in FIGS. 10 to 16 is repeated, whereby the multilayer wiring structure 1 illustrated in FIG. 1 can be obtained.

As described above, in the manufacturing method for the multilayer wiring structure 1 according to the present embodiment, the upper seed layer and lower seed layer formed on the bottom portion of the opening are removed partially, so that the main conductive layer (e.g., main conductive layer 13) in the lower wiring layer and the main conductive layer (e.g., main conductive layer 23) in the upper wiring layer can be brought into direct contact with each other at the bottom center portion of the opening.

In addition, the lower seed layer and upper seed layer remain in the bottom outer peripheral edge of the opening, so that, during the electrolytic plating, power can be fed to the main conductive layer of the lower wiring layer at this portion. Further, since the bottom outer peripheral edge of the opening is covered with the lower seed layer, the edge of the interlayer insulating film 61 contacting the main conductive layer 13 is covered with the lower seed layer 21 as dented by the symbol E of FIG. 19. This can prevent the interlayer insulating film 61 from peeling off at its edge.

Second Embodiment

Figure 20:
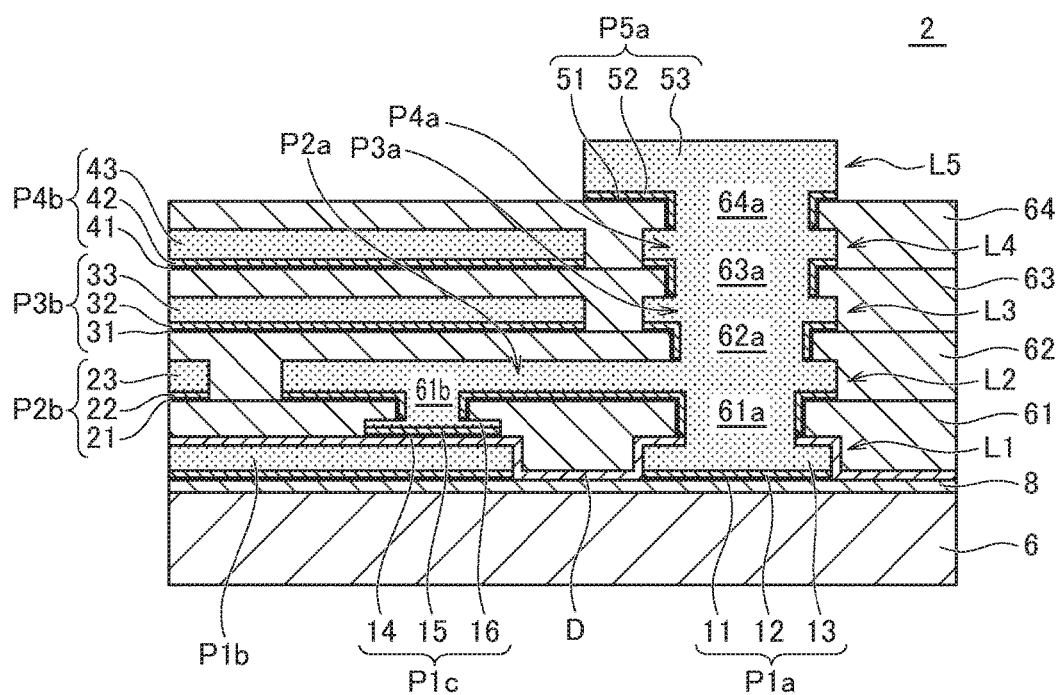
FIG. 20 is a schematic cross-sectional view for explaining the structure of a multilayer wiring structure according to a second embodiment of the present invention.

FIG. 20 is a schematic cross-sectional view for explaining the structure of a multilayer wiring structure 2 according to the second embodiment of the present invention.

The multilayer wiring structure 2 according to the present embodiment differs from the multilayer wiring structure 1 according to the first embodiment in that the removal range of each of the lower and upper seed layers (21, 31, 41, 51, and 22, 32, 42, 52) is enlarged over the entire bottom portion of the opening. Other configurations are the same as those of the multilayer wiring structure 1 according to the first embodiment, so the same reference numerals are given to the same elements, and overlapping description will be omitted.

In the present embodiment, an area where the main conductive layer (e.g., main conductive layer 13) in the lower wiring layer and the main conductive layer (e.g., main conductive layer 23) in the upper wiring layer are brought into direct contact with each other is increased, so that via resistance can be reduced further.

Third Embodiment

Figure 21:
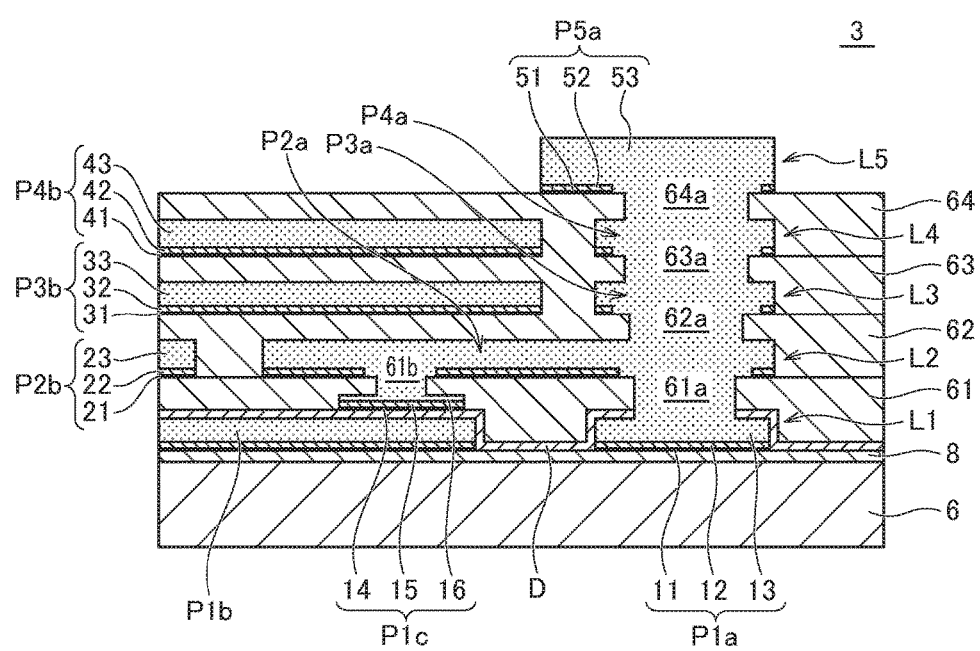
FIG. 21 is a schematic cross-sectional view for explaining the structure of a multilayer wiring structure according to a third embodiment of the present invention.

FIG. 21 is a schematic cross-sectional view for explaining the structure of a multilayer wiring structure according to the third embodiment of the present invention.

The multilayer wiring structure 3 according to the present embodiment differs from the multilayer wiring structure 2 according to the second embodiment in that the removal range of each of the lower and upper seed layers (21, 31, 41, 51, and 22, 32, 42, 52) is enlarged to the inner wall surface of the opening and the upper surface of the interlayer insulating film positioned at the periphery of the opening. Other configurations are the same as those of the multilayer wiring structure 2 according to the second embodiment, so the same reference numerals are given to the same elements, and overlapping description will be omitted.

In the present embodiment, the lower seed layers 21, 31, 41, and 51 and the upper seed layers 22, 32, 42, and each formed inside the opening are fairly removed, thereby facilitating the patterning of the photoresist (e.g., photoresist R2) for patterning of the above lower and upper seed layers.

It is apparent that the present invention is not limited to the above embodiments, but may be modified and changed without departing from the scope and spirit of the invention.

For example, although the seed layer is constituted of a laminated film of the lower seed layer and upper seed layer in the above embodiments, it may have a single layer structure constituted of only the lower seed layer.

Further, the main conductive layers of the respective wiring layers may have the same thickness or at least some of them may have a different thickness. That is, the thickness of the main conductive layer may be designed to a desired value.

What is claimed is:

1. A multilayer wiring structure comprising:
a first conductive pattern provided in a first wiring layer, the first conductive pattern including a first main conductive layer;
an interlayer insulating film covering the first wiring layer, the interlayer insulating film having an opening for exposing a part of the first conductive pattern; and
a second conductive pattern provided in a second wiring layer and connected to the first conductive pattern through the opening,
wherein the second conductive pattern includes a seed layer contacting the interlayer insulating film and a second main conductive layer provided on the seed layer, the second main conductive layer being formed of the same metal material as the first main conductive layer, and
wherein the seed layer is removed at least at a part of a bottom portion of the opening, thereby the first and second main conductive layers are brought into contact with each other at least at the part of the bottom portion of the opening without the seed layer being interposed therebetween.

2. The multilayer wiring structure as claimed in claim 1, wherein an inner wall surface and bottom outer peripheral edge of the opening are covered with the seed layer, and
wherein the first and second main conductive layers are brought into contact with each other at a center portion surrounded by the outer peripheral edge without the seed layer being interposed therebetween.

3. The multilayer wiring structure as claimed in claim 1, wherein the first and second main conductive layers are formed of copper (Cu).

4. The multilayer wiring structure as claimed in claim 3, wherein the seed layer is formed of chromium (Cr), nickel (Ni), titanium (Ti), tungsten (W), tantalum (Ta), or an alloy or laminate including any of the elements.

5. The multilayer wiring structure as claimed in claim 3, wherein a crystal of copper (Cu) constituting the first and second main conductive layers exists while crossing a boundary defining the bottom portion of the opening at a portion where the first and second main conductive layers are in contact with each other.

6. A method of manufacturing a multilayer wiring structure, the method comprising:
forming a first conductive pattern including a first main conductive layer;
forming an interlayer insulating film covering the first conductive pattern;
forming an opening in the interlayer insulating film for exposing a part of the first main conductive layer;
forming a seed layer on the interlayer insulating film and inside the opening;
exposing the first main conductive layer by removing at least partially the seed layer formed on a bottom portion of the opening; and forming a second main conductive layer formed of the same metal material as the first main conductive layer on the seed layer and the first main conductive layer exposed from the opening.

7. The method of manufacturing a multilayer wiring structure as claim in claim 6, wherein, in the exposing, the seed layer formed at the bottom portion of the opening is partially removed so that a contact portion between the first main conductive layer and the seed layer remains.

8. The method of manufacturing a multilayer wiring structure as claim in claim 7, wherein an electrolytic plating is performed by power feeding through the seed layer in the forming the second main conductive layer.

9. The method of manufacturing a multilayer wiring structure as claim in claim 8, wherein the seed layer includes a lower seed layer formed of chromium (Cr), nickel (Ni), titanium (Ti), tungsten (W), tantalum (Ta), or an alloy or laminate including any of the elements and an upper seed layer formed of copper (Cu).

10. An apparatus comprising:
a first metal layer;
an interlayer insulating film formed on the first metal layer, the interlayer insulating film having an opening that exposes a first area of the first metal layer;
a second metal layer formed on an inner wall of the opening; and
a third metal layer filling the opening via the second metal layer,
wherein the first and third metal layers are direct contact with each other at a bottom of the opening.

11. The apparatus as claimed in claim 10, wherein the second metal layer is made of a different material from the first and third metal layers.

12. The apparatus as claimed in claim 11, wherein the first metal layer is made of the same material as the third metal layer.

13. The apparatus as claimed in claim 12, wherein the second metal layer has higher in resistivity than the first and third metal layers.

14. The apparatus as claimed in claim 13, wherein the second metal layer has higher in resistivity than the first and third metal layers.

15. The apparatus as claimed in claim 10, wherein the second metal layer is further formed on a part of the first area of the first metal layer.

* * * * *